(12) United States Patent
Avila et al.

(10) Patent No.: US 9,384,839 B2
(45) Date of Patent: Jul. 5, 2016

(54) WRITE SEQUENCE PROVIDING WRITE ABORT PROTECTION

(71) Applicant: SanDisk Technologies Inc., Plano, TX (US)

(72) Inventors: Chris Nga Yee Avila, Saratoga, CA (US); Gautam Ashok Dusija, Milpitas, CA (US)

(73) Assignee: SanDisk Technologies LLC, Plano, TX (US)

( * ) Notice: Subject to any disclaimer, the term of this patent is extended or adjusted under 35 U.S.C. 154(b) by 287 days.

(21) Appl. No.: 13/788,415

(22) Filed: Mar. 7, 2013

(65) Prior Publication Data

US 2014/0254263 A1 Sep. 11, 2014

(51) Int. Cl.
*G11C 16/10* (2006.01)
*G11C 16/04* (2006.01)
*G11C 11/56* (2006.01)
*G11C 16/22* (2006.01)

(52) U.S. Cl.
CPC ............ *G11C 16/10* (2013.01); *G11C 11/5628* (2013.01); *G11C 16/0408* (2013.01); *G11C 16/22* (2013.01); *G11C 16/0483* (2013.01); *G11C 2211/5641* (2013.01); *G11C 2213/71* (2013.01)

(58) Field of Classification Search
CPC ........ G11C 16/04; G11C 11/34; G11C 16/10; G06F 12/02
USPC ................. 365/174, 185, 17, 185.29, 185.03, 365/185.17; 711/103
See application file for complete search history.

(56) References Cited

U.S. PATENT DOCUMENTS

| | | | |
|---|---|---|---|
| 5,070,032 A | 12/1991 | Yuan et al. | |
| 5,095,344 A | 3/1992 | Harari | |
| 5,313,421 A | 5/1994 | Guterman et al. | |
| 5,315,541 A | 5/1994 | Harari et al. | |
| 5,343,063 A | 8/1994 | Yuan et al. | |
| 5,570,315 A | 10/1996 | Tanaka et al. | |
| 5,661,053 A | 8/1997 | Yuan | |
| 5,768,192 A | 6/1998 | Eitan | |
| 5,903,495 A | 5/1999 | Takeuchi et al. | |
| 5,930,167 A * | 7/1999 | Lee et al. | 365/185.03 |
| 6,011,725 A | 1/2000 | Eitan | |
| 6,046,935 A | 4/2000 | Takeuchi et al. | |
| 6,222,762 B1 | 4/2001 | Guterman et al. | |
| 7,016,226 B2 | 3/2006 | Shibata et al. | |
| 7,057,939 B2 | 6/2006 | Li et al. | |
| 7,120,051 B2 | 10/2006 | Gorobets et al. | |

(Continued)

OTHER PUBLICATIONS

Notification of Transmittal of the International Search Report and the Written Opinion of the International Searching Authority, or the Declaration for Int'l Appl. No. PCT/US2014/018066 mailed Sep. 19, 2014, 10 pages.

(Continued)

*Primary Examiner* — Son Mai
*Assistant Examiner* — Muna A Techane
(74) *Attorney, Agent, or Firm* — Davis Wright Tremaine LLP

(57) ABSTRACT

In a multi-level cell (MLC) nonvolatile memory array, data is assigned sequentially to the lower and upper page of a word line, then both lower and upper pages are programmed together before programming a subsequent word line. Word lines of multiple planes are programmed together using latches to hold data until all data is transferred. Tail-ends of data of write commands are stored separately.

20 Claims, 12 Drawing Sheets

(56) References Cited

U.S. PATENT DOCUMENTS

| | | |
|---|---|---|
| 7,315,916 B2 | 1/2008 | Bennett et al. |
| 7,433,993 B2 * | 10/2008 | Sinclair ................. 711/103 |
| 7,505,320 B2 | 3/2009 | Li |
| 7,508,721 B2 | 3/2009 | Li et al. |
| 7,882,299 B2 * | 2/2011 | Conley et al. .......... 711/103 |
| 8,094,400 B1 | 1/2012 | Han |
| 8,244,960 B2 | 8/2012 | Paley et al. |
| 2008/0189473 A1 * | 8/2008 | Murray ................ 711/103 |
| 2009/0067241 A1 | 3/2009 | Gorobets et al. |
| 2010/0174845 A1 * | 7/2010 | Gorobets et al. ........... 711/103 |
| 2010/0174847 A1 * | 7/2010 | Paley et al. ............ 711/103 |
| 2010/0322000 A1 | 12/2010 | Shim et al. |
| 2011/0222342 A1 | 9/2011 | Yoon et al. |
| 2011/0280075 A1 * | 11/2011 | Shirota et al. ............ 365/185.17 |
| 2012/0220088 A1 | 8/2012 | Alsmeier |
| 2012/0256247 A1 | 10/2012 | Alsmeier |
| 2013/0279248 A1 * | 10/2013 | Shepard et al. .......... 365/185.03 |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

* cited by examiner

Programming into four states represented by a 2-bit code

Multistate Memory

Lower Page Programming (2-bit Code)

Upper Page Programming (2-bit Code)

| Plane 0 | | | Plane 1 | | | Plane 2 | | | Plane 3 | | |
|---|---|---|---|---|---|---|---|---|---|---|---|
| WL | LP | UP | WL | LP | UP | WL | LP | UP | WL | LP | UP |
| 0 | 0 | 1 | 0 | 2 | 3 | 0 | 4 | 5 | 0 | 6 | 7 |
| 1 | 8 | 9 | 1 | 10 | 11 | 1 | 12 | 13 | 1 | 14 | 15 |
| 2 | 16 | 17 | 2 | 18 | 19 | 2 | 20 |  | 2 |  |  |
| 3 |  |  | 3 |  |  | 3 |  |  | 3 |  |  |
| 4 |  |  | 4 |  |  | 4 |  |  | 4 |  |  |
| 5 |  |  | 5 |  |  | 5 |  |  | 5 |  |  |

*FIG. 13*

| Plane 0 | | | Plane 1 | | | Plane 2 | | | Plane 3 | | |
|---|---|---|---|---|---|---|---|---|---|---|---|
| WL | LP | UP | WL | LP | UP | WL | LP | UP | WL | LP | UP |
| 0 | 0 | 1 | 0 | 2 | 3 | 0 | 4 | 5 | 0 | 6 | 7 |
| 1 | 8 | 9 | 1 | 10 | 11 | 1 | 12 | 13 | 1 | 14 | 15 |
| 2 | 16 | 17 | 2 | 18 | 19 | 2 | X | X+1 | 2 | X+2 | X+3 |
| 3 | X+4 | X+5 | 3 | X+6 | X+7 | 3 | X+8 | X+9 | 3 |  |  |
| 4 |  |  | 4 |  |  | 4 |  |  | 4 |  |  |
| 5 |  |  | 5 |  |  | 5 |  |  | 5 |  |  |

WRITE SEQUENCE PROVIDING WRITE ABORT PROTECTION

BACKGROUND

This application relates to the operation of re-programmable non-volatile memory systems such as semiconductor flash memory that can store more than one bit per cell by writing multiple states, and more specifically, to methods of programming data in such memory systems so that earlier-written data is not endangered during programming of later data.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

In one common arrangement, individual cells may use two or more memory states to store one or more bits of data. Initially, a page of memory cells may be programmed with a "lower page" of data consisting of one bit per cell. Later programming may add an "upper page" of data in the same cells by writing an additional bit in each cell. More than two bits may also be successively stored in this way in some memory systems. Where data is programmed to cells that contain earlier-written data there is a danger that the earlier-written data may be damaged by the writing process so that it may not be recoverable. For example, if a write abort occurs during writing of upper page data then lower page data may be unrecoverable from the memory cells because they are in some intermediate states that do not reflect the lower page bits. Where earlier-written data is from another write command the data may be unrecoverable from any other source (i.e. there may be no other copy). Avoiding endangering such data during later programming is generally desirable.

SUMMARY OF THE INVENTION

Data of a given write command may be programmed in a multi-level cell (MLC) flash memory so that no data of the write command is left in a lower page with an unwritten upper page where it could be at risk during subsequent programming of the upper page when executing a subsequent write command. Data may be assigned to word lines sequentially, with both lower and upper pages being filled in each word line. At the end of the data for a particular write command, if there is a tail-end that is less than a full word line (e.g. lower page only) then this tail-end is stored in an alternate location, thus avoiding storing any data in a partially filled word line in the main portion of the memory array. In multi-plane memories, data may be assigned to word lines of each plane (both lower and upper pages of each word line). Then all planes may be programmed together in parallel with both lower and upper page data.

An example of a method of programming a multi-level cell (MLC) memory array includes: determining whether data to be stored is sufficient to fill a lower page and an upper page of a word line; if the data to be stored is sufficient to fill the lower page and the upper page of the word line, then programming the lower page and the upper page together without programming other data to any other word line between the programming of the lower page and the programming of the upper page; and if the data to be stored is insufficient to fill the lower page and the upper page of the word line, then programming the data at an alternate location other than the word line. The word line may be in a first erase block and the alternate location may be in a second erase block. If remaining data to be stored after the programming of the lower page and the upper page together is sufficient to fill a lower page and an upper page of an additional word line, then the lower page and the upper page of the additional word line may be programmed together without programming other data to any other word line. The determination may be performed for a plurality of additional word lines, with the data to be stored being sufficient to fill lower pages and upper pages of each of the plurality of additional word lines, each of which has its lower page and its upper page programmed together without programming other data to any other word line between the programming of its lower page and the programming of its upper page. If the remaining data to be stored is insufficient to fill the lower page and the upper page of the additional word line then the data may be programmed to the alternate location. The MLC memory may be a 3-D NAND memory which has NAND strings extending perpendicular to a substrate.

An example of a method of programming a multi-plane multi-level cell (MLC) memory array includes: receiving a plurality of units of data to be stored in a plurality of planes of the multi-plane MLC memory array; assigning the plurality of units of data for storage in the following predetermined order: first plane, first word line, lower page; subsequently, first plane, first word line, upper page; subsequently, second plane, first word line, lower page; subsequently, second plane, first word line, upper page; and subsequently, programming the lower pages and the upper pages of the first word lines of the first and second planes together without intervening programming of any other word lines of the first and second planes.

Units of data may be latched in the predetermined order until lower and upper pages of the first word line of the first and second planes can be programmed together in response to a command that indicates that programming is to be performed together. The plurality of planes may include a third plane and a fourth plane, and the predetermined order may extend, subsequent to the second plane, first word line, upper page, as follows: third plane, first word line, lower page; subsequently, third plane, first word line, upper page; subsequently, fourth plane, first word line, lower page; and subsequently, fourth plane, first word line upper page. The upper pages and lower pages of the first word lines of the first, second, third, and fourth planes may be programmed together without intervening programming of any other word lines of the first, second, third, and fourth planes. Additional units of data of the plurality of units of data may be assigned for storage in the plurality of planes in one or more subsequent word lines of the plurality of planes in the following order: first plane, lower page; subsequently, first plane, upper page; subsequently, second plane, lower page; and subsequently, second plane, upper page. The plurality of units of data to be stored may end with one or more units assigned to a lower page, and the one or more units assigned to the lower page may be programmed in an alternate location other than the lower page. The one or more units assigned to the lower page may be programmed in the alternate location using single-level cell (SLC) programming.

An example of a multi-plane multi-level cell (MLC) memory array includes: a first plurality of word lines for storing portions of write-command data that are sufficiently large to occupy both an upper page and a lower page of an individual word line; and a second plurality of word lines for storing portions of write-command data that are too small to occupy both an upper page and a lower page of an individual word line.

The multi-plane MLC memory may include a plurality of latches for holding both upper page data and lower page data for programming together to an individual word line of the first plurality of word lines. The second plurality of word lines may store portions of write-command data in a different format to a format used for storage of data in the first plurality of word lines. The multi-plane MLC memory may be formed on a plurality of memory dies and each die may contain some of the first plurality of word lines and some of the second plurality of word lines. The memory may be a three-dimensional memory that includes strings of memory cells that extend in a direction that is perpendicular to a substrate.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 13 illustrates how data of a particular write command may be assigned to lower and upper pages of word lines in a multi-plane memory array.

FIG. 14 illustrates storage of tail-ends of data of different write commands in an alternate location.

DETAILED DESCRIPTION

Memory System

Figure 1:
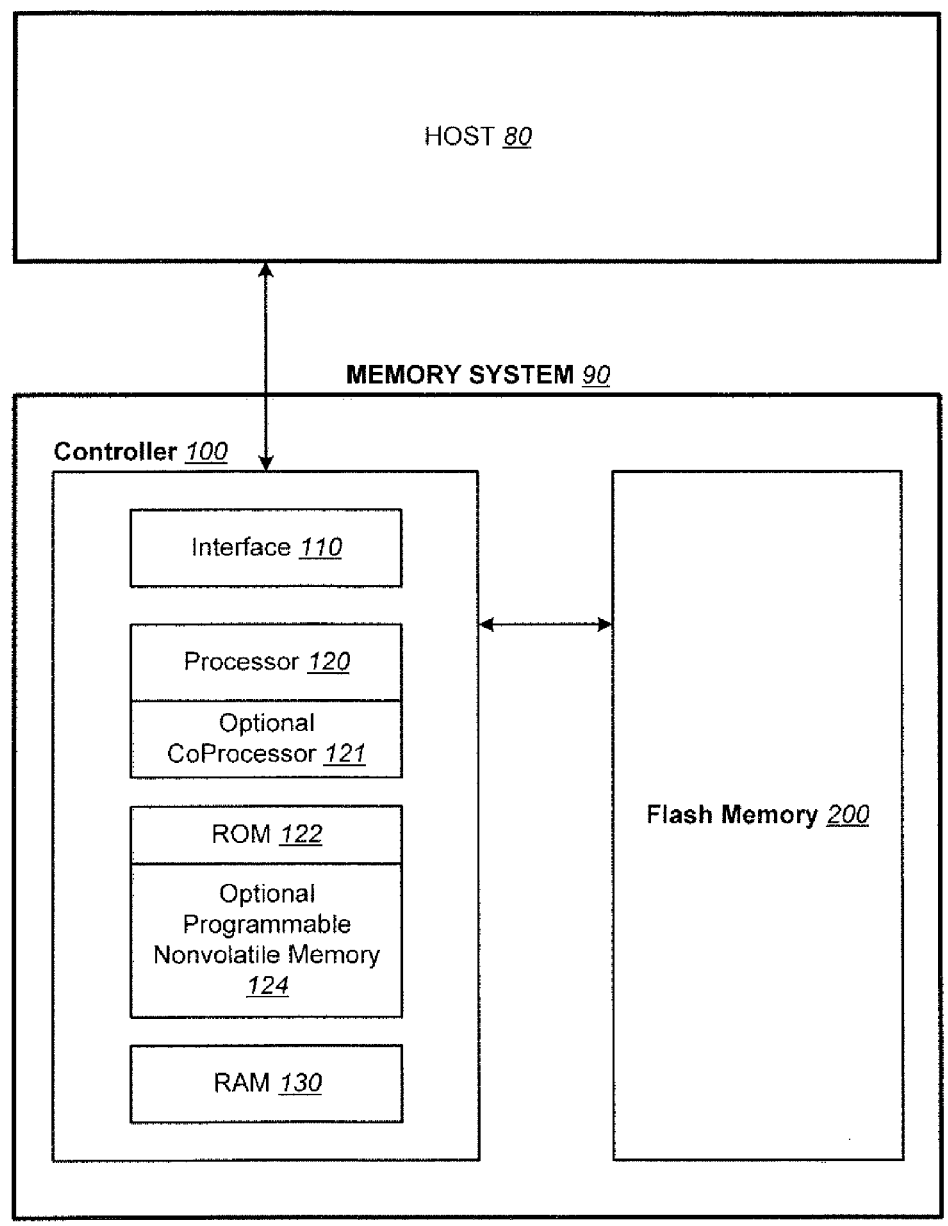
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

Physical Memory Structure

Figure 2:
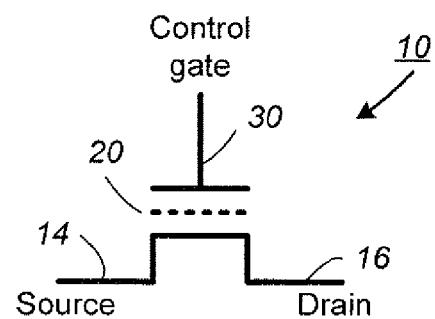
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
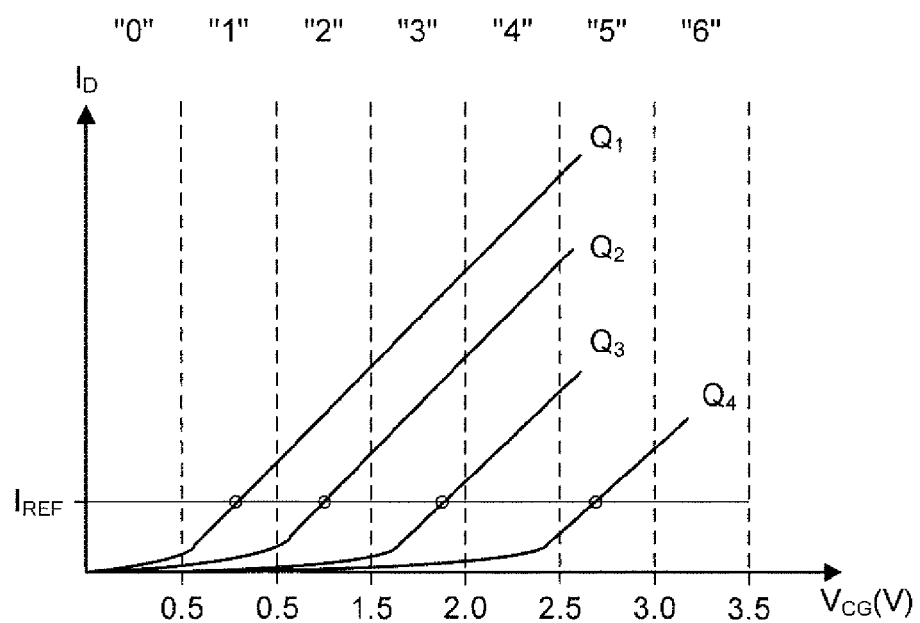
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven programmed memory states "0", "1", "2", "3", "4", "5", "6", and one erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

Figure 4A:
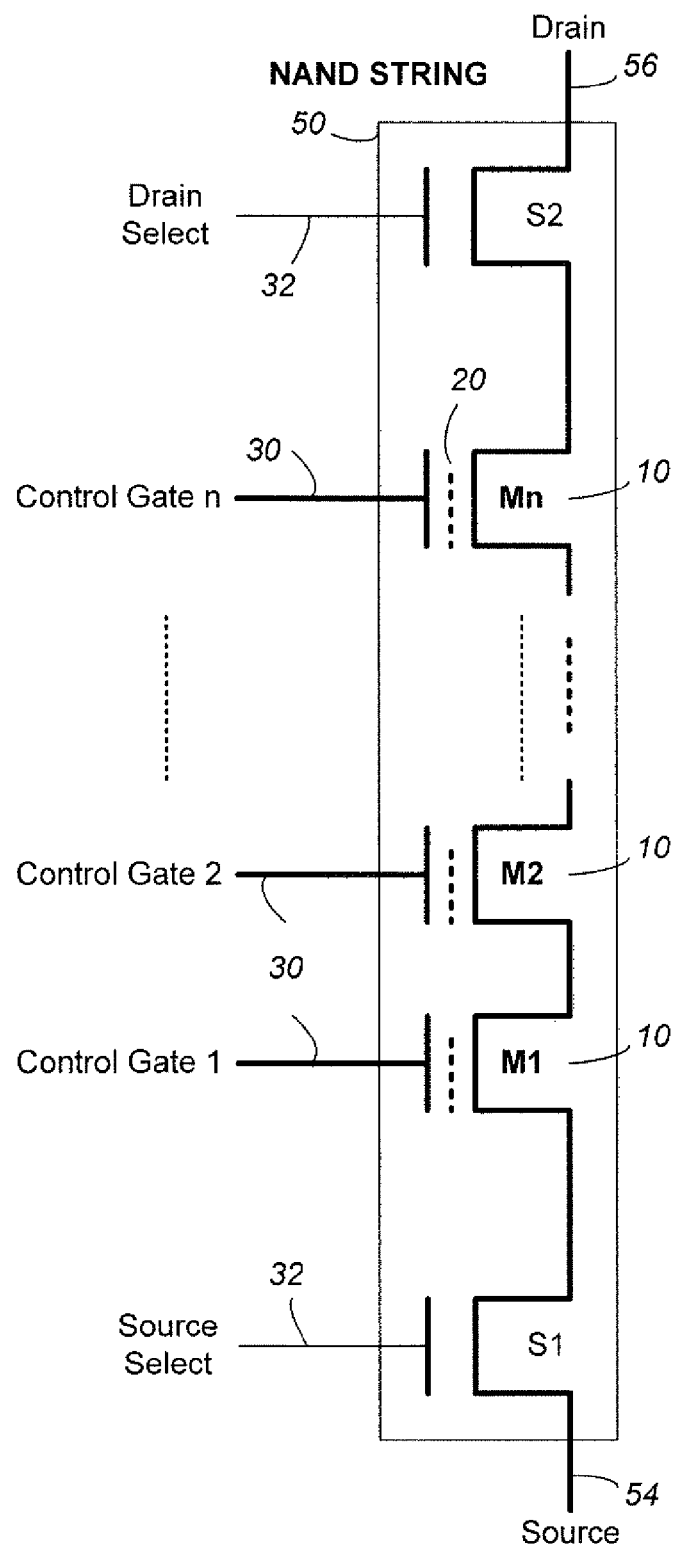
FIG. 4A illustrates schematically a string of memory cells organized into a NAND string.

FIG. 4A illustrates schematically a string of memory cells organized into a NAND string. A NAND string 50 comprises of a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
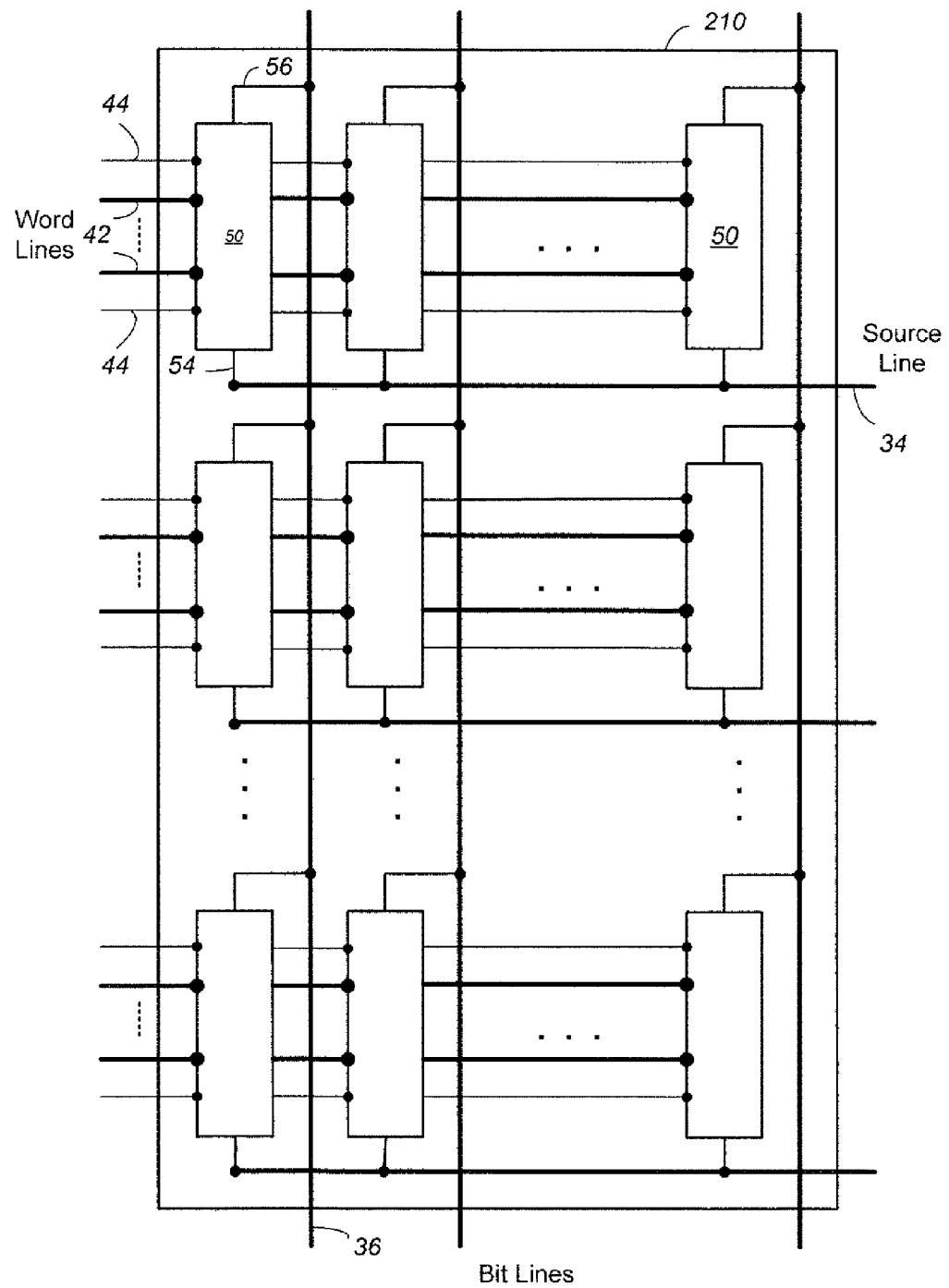
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
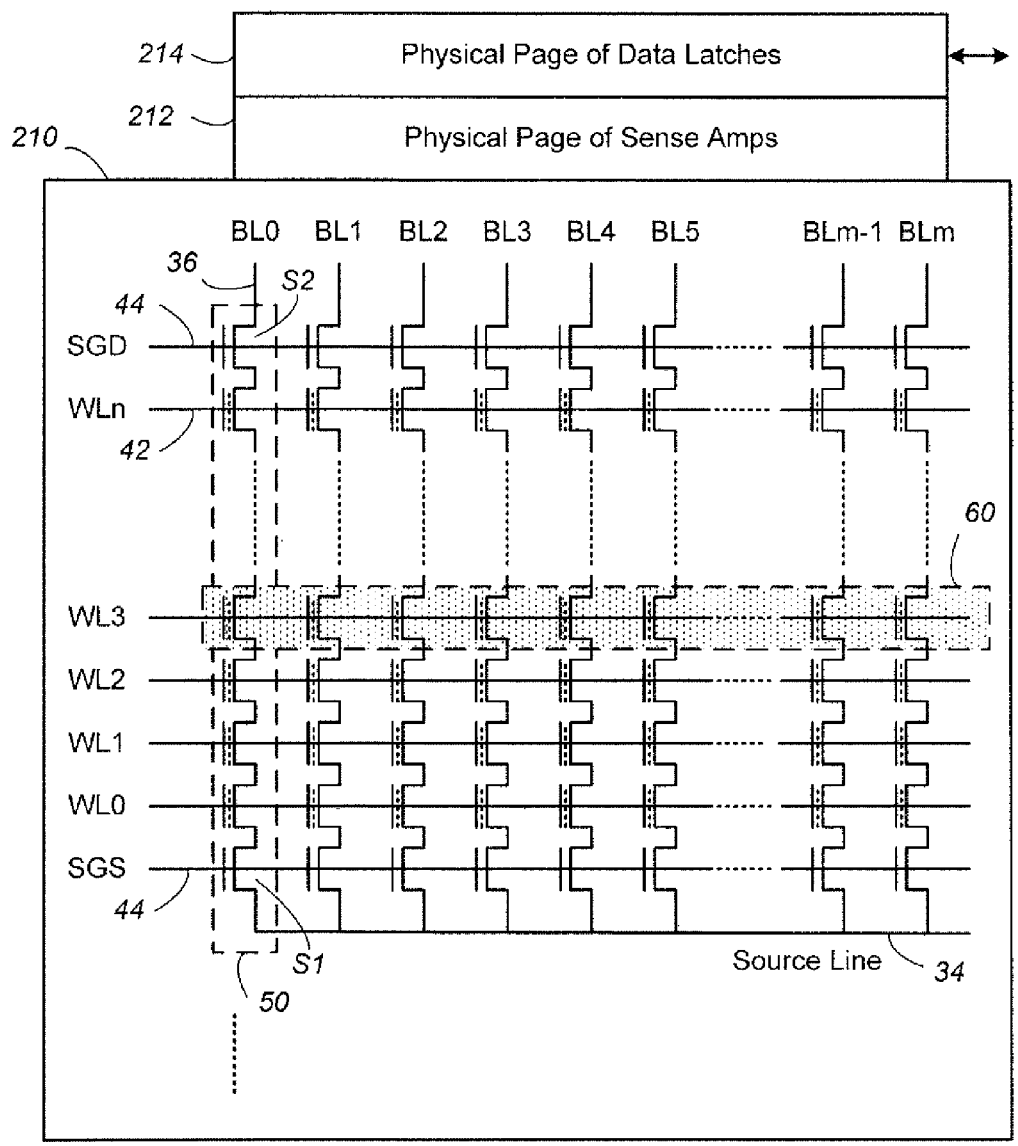
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that update data cannot overwrite existing one and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 6:
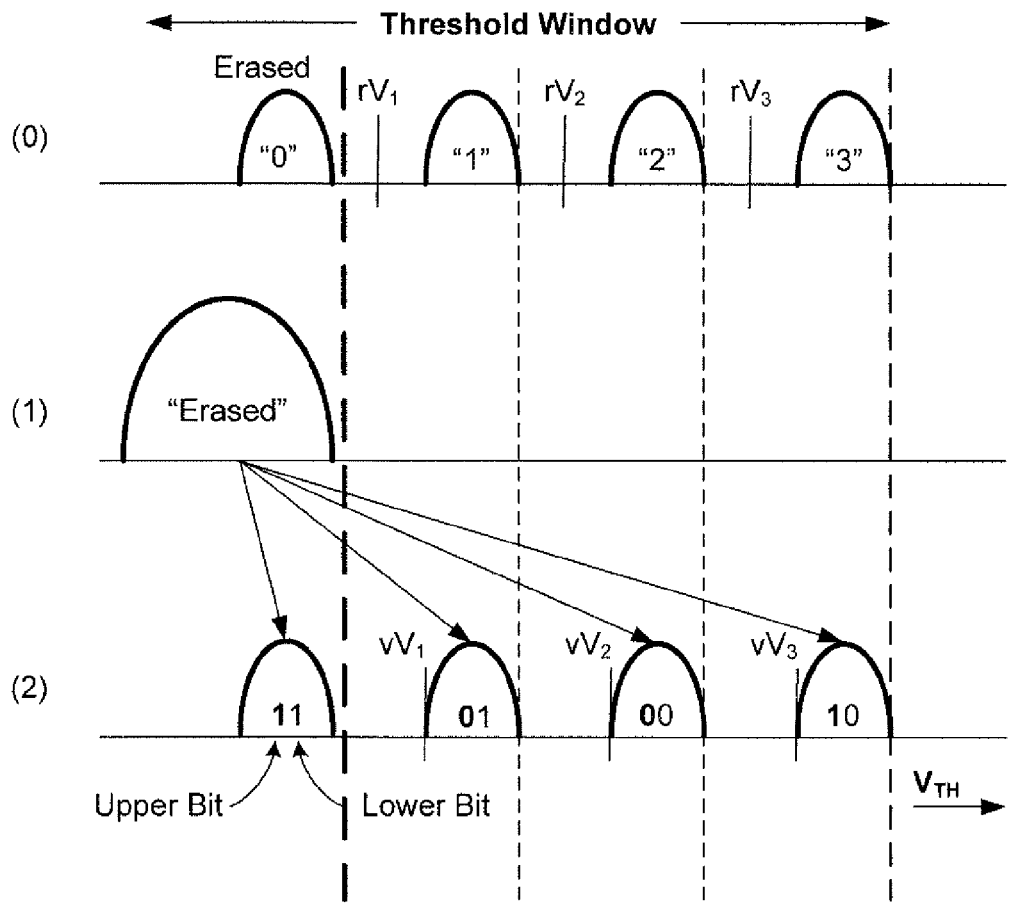
FIG. 6 illustrates an example of programming a population of 4-state memory cells.

FIGS. 6(0)-6(2) illustrate an example of programming a population of 4-state memory cells. FIG. 6(0) illustrates the population of memory cells programmable into four distinct distributions of threshold voltages respectively representing memory states "0", "1", "2" and "3". FIG. 6(1) illustrates the initial distribution of "erased" threshold voltages for an erased memory. FIG. 6(2) illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 6(1) will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

Bit-by-Bit MLC Programming and Reading

Figure 7A:
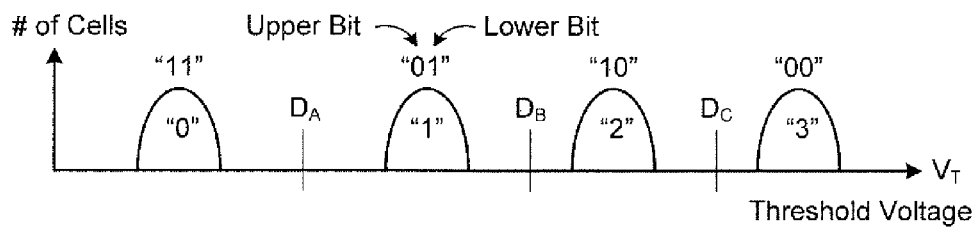
FIGS. 7A-7C illustrate an example of the programming of the 4-state memory encoded with a given 2-bit code.
Figure 7B:
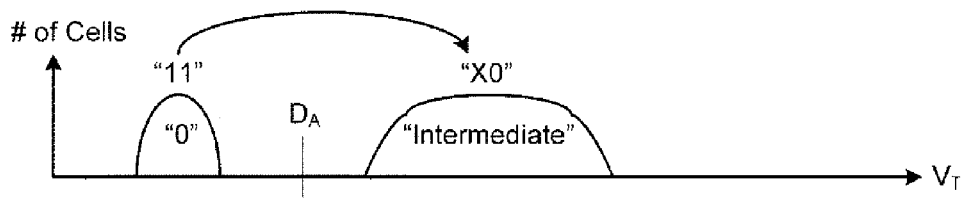
Figure 7C:
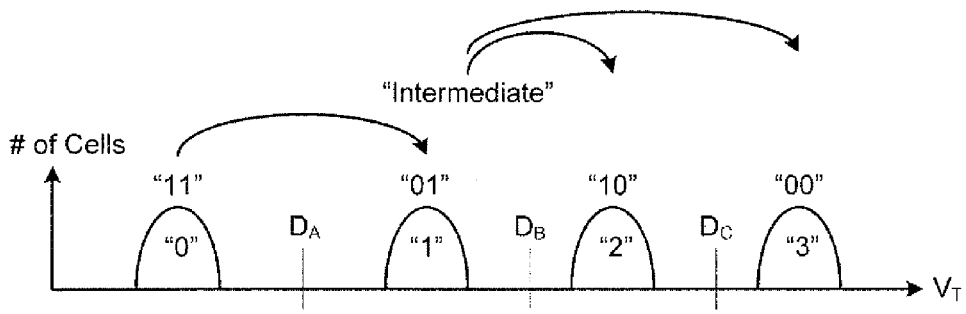

FIGS. 7A-7C illustrate the programming of the 4-state memory encoded with a given 2-bit code. FIG. 7A illustrates threshold voltage distributions of the 4-state memory array when each memory cell stores two bits of data using the 2-bit code. Such a 2-bit code has been disclosed in U.S. Pat. No. 7,057,939.

FIG. 7B illustrates the lower page programming (lower bit) in a 2-pass programming scheme using the 2-bit code. The fault-tolerant LM New code essentially avoids any upper page programming to transit through any intermediate states. Thus, the first pass lower page programming has the logical state (upper bit, lower bit)=(1, 1) transits to some intermediate state (x, 0) as represented by programming the "unprogrammed" memory state "0" to the "intermediate" state designated by (x, 0) with a programmed threshold voltage greater than $D_A$ but less than $D_C$.

FIG. 7C illustrates the upper page programming (upper bit) in the 2-pass programming scheme using the 2-bit code. In the second pass of programming the upper page bit to "0", if the lower page bit is at "1", the logical state (1, 1) transits to (0, 1) as represented by programming the "unprogrammed" memory state "0" to "1". If the lower page bit is at "0", the logical state (0, 0) is obtained by programming from the "intermediate" state to "3". Similarly, if the upper page is to remain at "1", while the lower page has been programmed to "0", it will require a transition from the "intermediate" state to (1, 0) as represented by programming the "intermediate" state to "2".

It can be seen that, during the programming of an upper page as illustrated in FIG. 7C, memory cells transition through conditions that may make it difficult or impossible to resolve lower page bits. For example, cells being programmed from state 0 to state 1 may have threshold voltages between $D_A$ and $D_B$ at the same time that cells being programmed from state 1 to states 2 and 3 still have threshold voltages between $D_A$ and $D_B$. Thus, threshold voltages for cells with lower bit "0" and lower bit "1" may overlap and so resolving the lower bit may not be possible.

In the bit-by-bit scheme for a 2-bit memory, a physical page of memory cells will store two logical data pages, a lower data page corresponding to the lower bit and an upper data page corresponding to the upper bit. In other examples, additional pages of data may be stored by storing more than two bits per cell in a physical page. In general, when programming an upper page of data into cells that contain one or more previously programmed lower pages, the lower page data may not be resolvable throughout the programming of the upper page. Thus, if there is a write abort during the programming of the upper page, then the lower page data may be unrecoverable and may be permanently lost.

Figure 8:
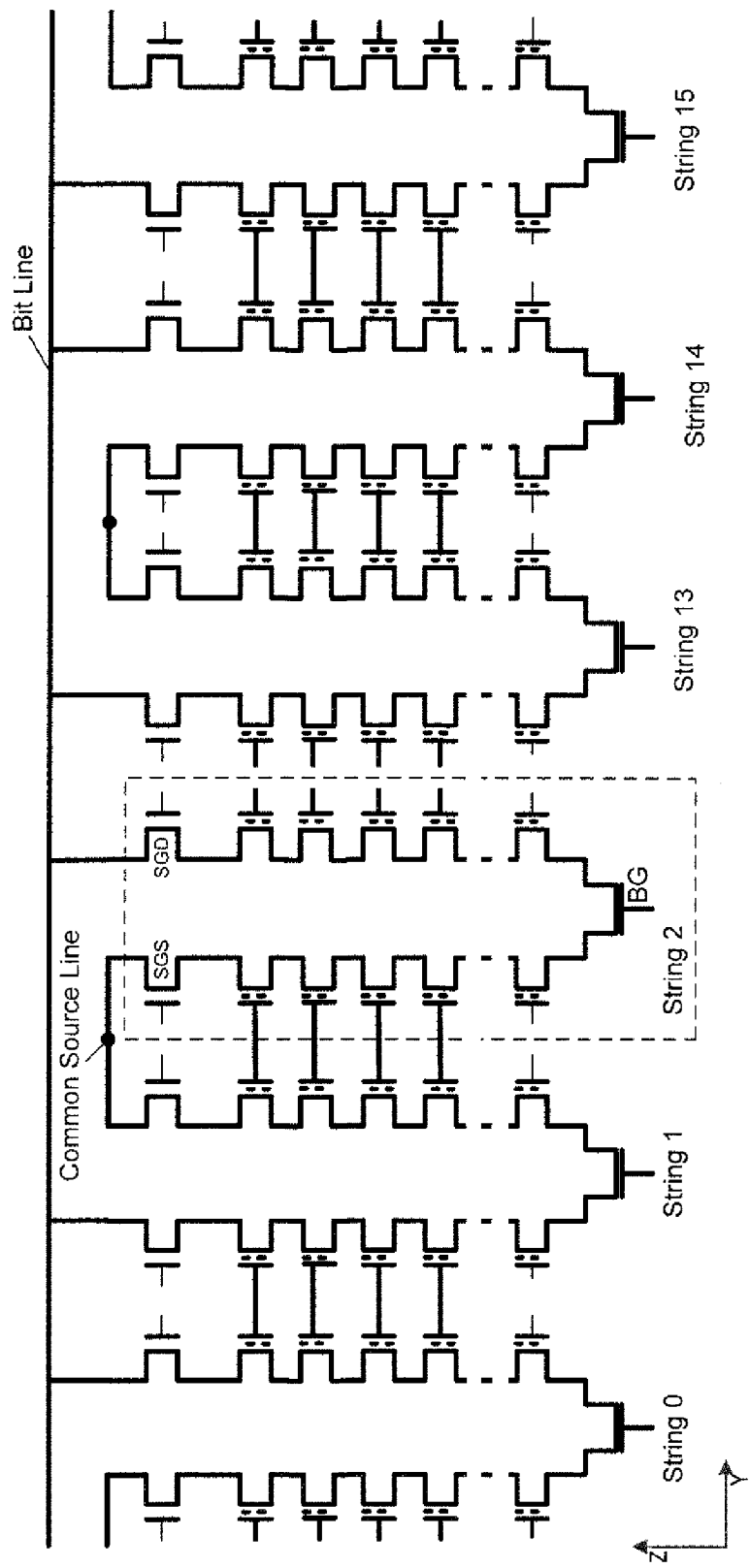
FIG. 8 shows an example of a three-dimensional NAND flash memory array.

FIG. 8 shows another type of flash memory array, a three-dimensional NAND array in which NAND strings extend vertically (in the direction perpendicular to the substrate) with memory cells stacked in the vertical direction. The array shown in FIG. 8 has U-shaped NAND strings. Other examples may have straight NAND strings with connections at the substrate and at the top of the NAND string. Examples of three-dimensional flash memory arrays are described in U.S. Patent Publication Nos. 2012/0220088 and 2012/0256247. The different geometry of three-dimensional NAND may have various benefits including allowing more memory cells to fit in a given area on a memory chip. However, three-dimensional NAND arrays suffer from many of the same problems as planar NAND including the danger of losing lower page data when programming upper page data in MLC NAND.

The sequence in which data is assigned to word lines, and to lower and upper pages within word lines, may be important for several reasons. In particular, cell-to-cell coupling between cells in adjacent word lines may be affected by the order of programming. It has been found that certain programming schemes that only program an upper page of a word line after programming of the lower page of its neighbor can reduce disturbance caused by such cell-to-cell coupling.

Figures 9, 10, 11:
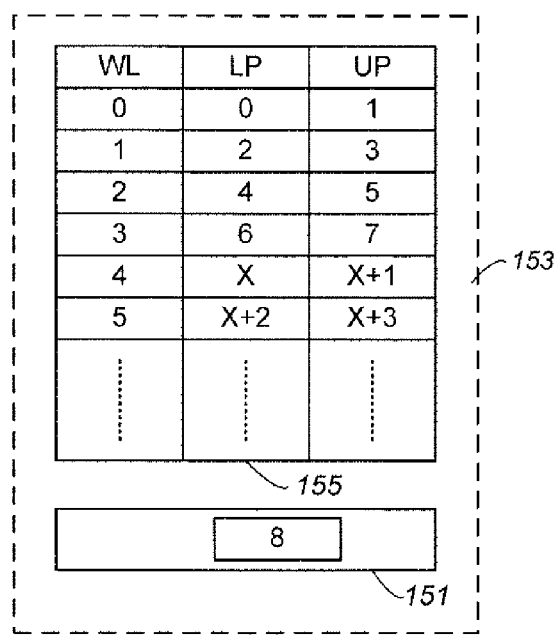
FIG. 9 shows an example of a scheme for assigning data to lower and upper pages of word lines.
FIG. 10 shows another example of a scheme for assigning data to lower and upper pages of word lines.
FIG. 11 shows an example of storing the tail-end of data of a particular write command in an alternate location.

FIG. 9 shows an example of a sequence of writing lower page ("LP") and upper page ("UP") data to word lines ("WL") of a block. The lower page of word line 0 is programmed first, followed by the lower page of word line 1. Then the upper page of word line 0 is programmed. Thus, between programming the lower page of word line 0 and the upper page of word line 0, the lower page of word line 1 is programmed. Then, the lower page of word line 2 is programmed, followed by the upper page of word line 1. Thus, between programming the lower page and the upper page of word line 1, the upper page of word line 0 and the lower page of word line 2 are programmed. This alternating between word lines helps to reduce the effect of cell-to-cell coupling between cells of different word lines on memory cell states. However, it may lead to leaving lower page data exposed to danger during subsequent upper page programming.

FIG. 9 shows data 0-9 stored in word lines 0-5. Because of the order of storing data, two logical pages of data (7 and 9) are stored as lower pages of word lines that do not have any upper page data stored (WLs 4 and 5). The data of logical pages 7 and 9 may be at risk during a subsequent programming of upper pages of word lines 4 and 5. It can be seen that at the end of executing a write command using the sequence of FIG. 9, there will always be either one or two lower pages remaining that do not have upper page data (e.g. if the write command ended at logical page 8, and there was no logical page 9, then only logical page 7 would be exposed).

In many cases, when a write command is executed and the data has been programmed successfully (verified) the data is considered "committed." Until data is committed, the host generally maintains a copy of any data it has sent for storage because it does not know whether the memory has successfully stored the data or not. Once the data is committed, the host generally does not maintain a copy and there may be no way to recover the data if the data cannot be obtained from the memory system. Thus, the safety of such committed data is particularly important. Data from an earlier write command is generally committed when a subsequent write command is received and is being executed. Thus, the data stored in FIG. 9 would generally be committed when upper pages of word lines 4 and 5 are to be programmed in response to a subsequent write command. Keeping such committed data safe is particularly important.

FIG. 10 shows a write sequence that provides some reduction in exposure of lower page data. In the sequence shown, each word line is programmed in sequence, with both lower page and upper page data without intervening programming of any other word lines. Thus, the lower page of word line 0 is programmed, then the upper page of word line 0, and only then does programming of word line 1 begin. In some cases, the lower page is programmed first and subsequently the upper page is programmed. In other cases, the lower and upper pages are programmed together in what may be referred to as "full-sequence" programming. In either case, word lines are programmed in sequential order, with each word line being fully programmed before moving to the next word line.

FIG. 10 shows logical pages 0-8 that are stored in response to a write command. It can be seen that logical page 8 is exposed to a subsequent write to the upper page of word line 4 and thus data of logical page 8 is at risk. In some cases there will be no such exposed data using this scheme (e.g. if an even number of logical pages was received such as in FIG. 9, then there would be no last logical page to store in a lower page). The worst case for such a 2-bit per cell memory is that one logical page is exposed as shown in FIG. 10. This is in contrast to the scheme of FIG. 9 which exposes either one logical page or two (never zero).

FIG. 11 shows a scheme for protecting data such as logical page 8 of FIG. 10. In particular, data that is assigned for storage in the lower page of a word line, where there is no data of the present write command to be stored in the upper page is not stored in the lower page of the word line to which it is assigned. Instead of storing it in the lower page of the word line to which it is assigned (WL 4 in this example), where it would be exposed to damage during execution of a subsequent write command, the data is stored at an alternate location 151 in the memory array 153. Thus, in the main portion 155 of the memory array, any word line that is written has both lower and upper pages written (a lower page alone is never written).

The alternate location shown may be in a separate block, or blocks, in the memory array that is dedicated to storing such tail-ends of write commands. The alternate location may operate using different operating parameters to the main portion of the memory array. For example, the alternate location may include blocks that store data in single level cell (SLC) format (in contrast to the main portion where data is stored in MLC format). Such alternate location may be part of binary cache, for example, as described in U.S. Pat. Nos. 8,244,960 and 8,094,400, or may be a separate structure. The alternate location may be in an area of the memory array that is used for multiple purposes such as a scratch pad block. Examples of scratch pad blocks and methods of using them are described in U.S. Pat. No. 7,315,916.

Aspects of the present invention may be particularly advantageous when applied to multi-plane memory arrays. In general, a plane is a portion of a memory array that is independently operable and has its own word line and bit line decoder circuits. Examples of multi-plane memory arrays are described in U.S. Pat. Nos. 7,120,051, and 7,913,061.

Figure 12:
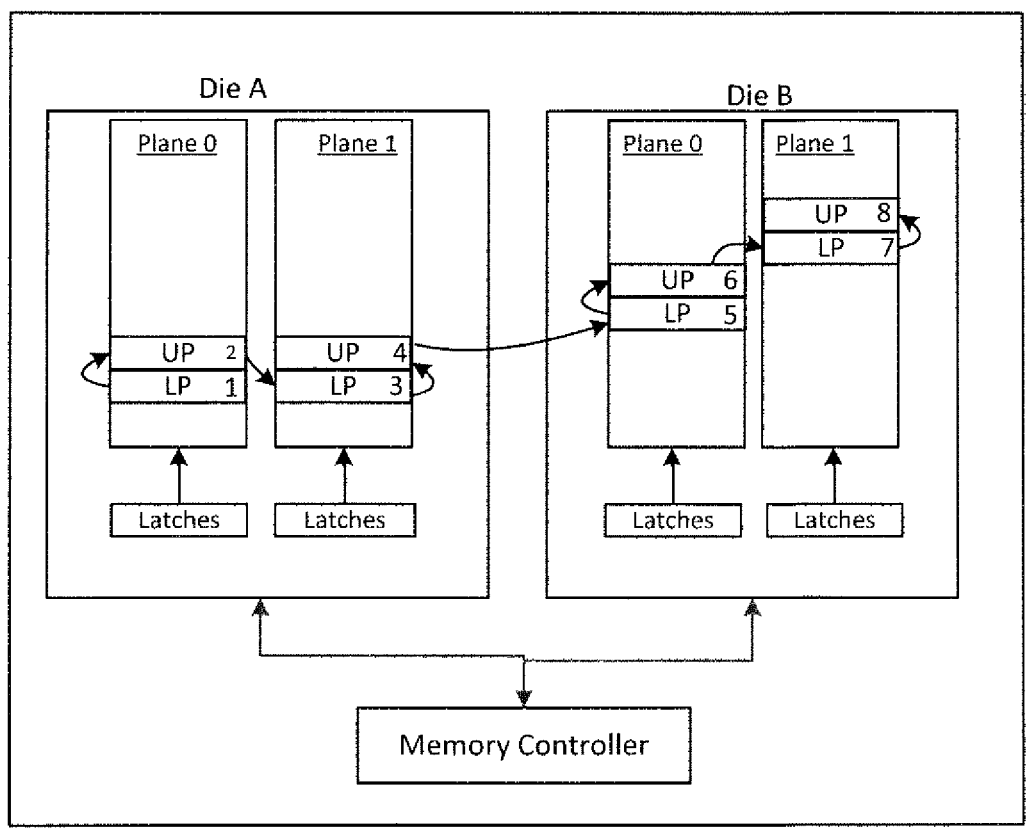
FIG. 12 shows an example of a scheme for assigning data of a write command to lower and upper pages of word lines in a multi-plane memory array.

FIG. 12 shows an example of a memory system that includes four planes on two different dies (die A and die B, each containing plane 0 and plane 1). The order of assigning data to word lines of the planes is illustrated by the arrows and numbers shown. Starting with plane 0 of die A, data is assigned to the lower page, then the upper page. Then, data is assigned to the lower page and the upper page of plane 1 of die A. Then, the lower and upper pages of die B, plane 0; followed by the lower and upper pages of die B, plane 1. This sequence is in contrast to many prior assignment schemes which stripe data across planes so that data for all lower pages can be sent and programmed, followed by data for all upper pages.

According to an example assignment scheme, data sufficient to fill word lines (both lower and upper pages) is assigned to word lines of successive planes and then all planes are programmed together with both lower and upper page data. Latches are provided so that both lower page and upper page data may be latched prior to programming.

In general, the assignment scheme shown in FIG. 12 continues for as many word lines as can be filled with data of a given write command. After programming all planes, data is latched for subsequent programming in the same order. This continues until the tail-end of the data of the write command. The tail-end of the data of the write command may be assigned to a location in a lower page so that if it was programmed to its assigned location, it would be exposed to a subsequent write of the upper page. Accordingly, such data is not stored at its assigned location, but instead is stored in an alternate location.

FIG. 13 shows logical pages 0-20 that are stored in response to a write command. Logical page 20 is the last data of the write command and it occupies the lower page of word line 2 in plane 2. No data of the write command is assigned to the upper page of word line 2 in plane 2. Thus, if logical page 20 was written at its assigned location it would be exposed to a subsequent write of the upper page of word line 2 in plane 2.

Instead of writing logical page 20 in its assigned location in the lower page of word line 2 in plane 2, logical page 20 is written to an alternate location 401 as shown in FIG. 14. This means that no word line in the main portion 403 of the memory array 405 is partially written (e.g. lower page only) at the end of executing the write command. The last write step of the write command in the main portion 403 programs logical pages 16-19 to word line 2 (both upper and lower pages) in planes 0 and 1. Programming of logical page 20 in the alternate location may be performed at least partially in parallel with programming logical pages 16-19. For example, logical page 20 may be stored in a different block in plane 2 so that it can be programmed in parallel with logical pages 16-19.

When a subsequent write command is received, the data of the subsequent write command begins with data X and is stored as shown in FIG. 14. The subsequent write command ends with data X+10, which is assigned to the lower page of word line 3 in plane 3. Because this is a lower page, data X+10 is stored in the alternate location 401. Thus, at the end of executing the subsequent write command all written word lines in the main portion of the memory array are filled (both lower and upper pages written). Tail-ends of both write commands are stored in the alternate location 401. Other write commands may have an even number of logical pages and may not have any tail-ends that need to be stored in an alternate location.

Figure 15A:
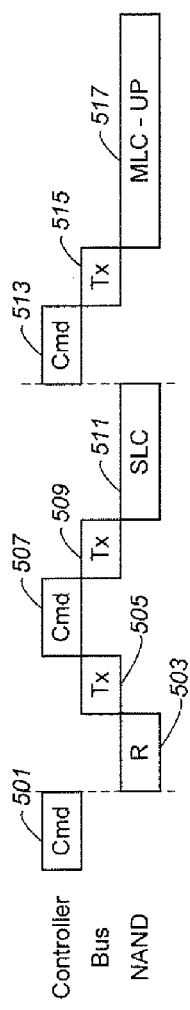
FIG. 15A-C are timing diagrams that illustrate different schemes for programming data of a write command.

Some advantages of aspects of the present invention may be seen from comparisons of different programming schemes. FIG. 15A is a timing diagram for a prior art scheme in which exposed data is copied prior to writing upper page data in the same memory cells. A command 501 is issued by the controller to read the lower page data. The lower page data is then read 503 and transferred 505 to the controller. A write command 507 is then issued, and the data transferred 509 to the memory, where the data is written 511 in SLC mode (which is quicker than writing in MLC mode). Subsequently, the controller issues the command 513 to program upper page data. The data is transferred 515 to the memory, and the data is programmed 517. It can be seen that this scheme suffers from the disadvantage that significant time is needed to copy the lower page data prior to writing the upper page data. In some cases, such a delay may cause a host to time-out (i.e. the host expects the memory to respond within a certain time period to indicate that the data is stored—failure to respond in time may cause the host to consider the memory to be defective).

Figure 15B:
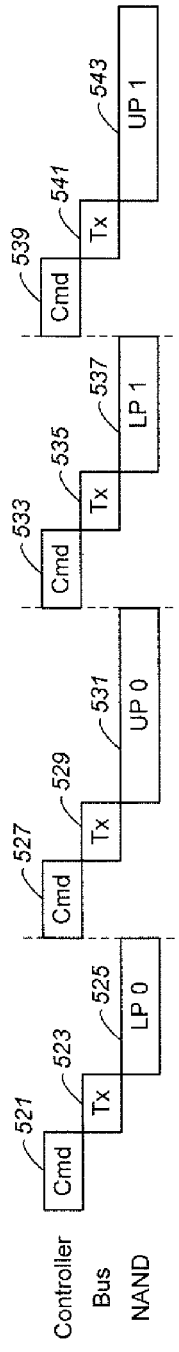

FIG. 15B is a timing diagram for storage of data in two planes according to the sequence: shown in FIG. 12 using conventional commands. The controller first sends a command 521 to program lower page data in plane 0. The data is transferred 523 and programmed 525. Only after this is completed does the controller send a command 527 to program the upper page in plane 0. This data is then transferred 529 and programmed 531. Once this is complete, the controller sends a command 533 to program lower page data in plane 1. This data is transferred 535 and programmed 537. Subsequently, the controller sends a command 539 to program the upper page in plane 1 and the data is transferred 541 and programmed 543. Such sequential operation can be seen to be inefficient.

Figure 15C:
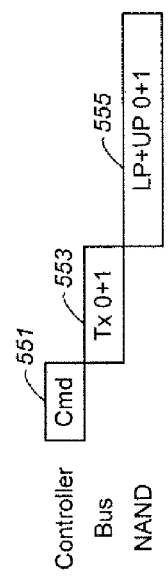

FIG. 15C is a timing diagram for storage of data in two planes according to the sequence shown in FIG. 12 using latches to store lower and upper pages for programming together and using a command that indicates to the memory that lower and upper pages of both planes are to be programmed together. The command 551 is sent by the controller, followed by a transfer 553 of data for both planes 0 and 1 (lower and upper pages). Then, both planes program lower and upper pages together 555. It can be seen that this provides a considerable time saving because of parallel operation of both planes. An even greater time saving may be achieved where more than two planes are programmed in parallel in this manner.

Conclusion

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method comprising:
   determining whether data to be stored is insufficient to fill a lower page and an upper page of a word line;
   if the data to be stored is sufficient to fill the lower page and the upper page of the word line, then programming the lower page and the upper page together without programming other data to any other word line between the programming of the lower page and the programming of the upper page; and
   if the data to be stored is insufficient to fill the lower page and the upper page of the word line, then programming the data at an alternate location other than the word line.

2. The method of claim 1 wherein the word line is in a first erase block and the alternate location is in a second erase block.

3. The method of claim 1 further comprising, if remaining data to be stored after the programming of the lower page and the upper page together is sufficient to fill a lower page and an upper page of an additional word line, then programming the lower page and the upper page of the additional word line together without programming other data to any other word line.

4. The method of claim 3 wherein the determination is performed for a plurality of additional word lines, with the data to be stored being sufficient to fill lower pages and upper pages of each of the plurality of additional word lines, each of which has its lower page and its upper page programmed together without programming other data to any other word line between the programming of its lower page and the programming of its upper page.

5. The method of claim 3 wherein if the remaining data to be stored is insufficient to fill the lower page and the upper page of the additional word line then programming the data to the alternate location.

6. An apparatus comprising:
   a multi level cell (MLC) 3-D NAND memory array including a plurality of NAND strings extending perpendicular to a substrate and a plurality of word lines, an individual word line configured to store a lower page and an upper page;
   a circuit configured to determine if data to be stored is sufficient to fill a lower page and an upper page of a word line;
   a circuit configured to program the lower page and the upper page together without programming other data to any other word line between the programming of the lower page and the programming of the upper page when the data to be stored is determined to be sufficient to fill the lower page and the upper page of the word line; and a circuit configured to program the data to be stored at an alternate location other than the word line when the data to be stored is insufficient to fill the lower page and the upper page of the word line.

7. The method of claim 1 wherein, the programming the lower page and the upper page together comprises:
    holding lower page data and upper page data together in latches; and
    subsequently, programming the lower page data and the upper page data together along the word line.

8. The method of claim 7 further comprising: prior to holding the lower page data and the upper page data together in the latches, receiving a command that indicates that lower and upper pages are to be programmed together.

9. The method of claim 8 wherein the command further indicates that one or more additional word lines in one or more additional planes are to be programmed.

10. The method of claim 1 wherein the word line is in a main portion of the MLC memory array and the alternate location is in a Single Level Cell (SLC) block in a binary cache.

11. The apparatus of claim 6 wherein the NAND strings are U-shaped.

12. The apparatus of claim 6 wherein the NAND strings comprise memory cells stacked in a vertical direction perpendicular to the substrate.

13. The apparatus of claim 6 wherein the word line is in a first erase block and the alternate location is in a second erase block.

14. The apparatus of claim 6 wherein the alternate location is in a binary cache.

15. A system comprising:
    a multi-level cell (MLC) 3-D NAND memory array including a plurality of NAND strings extending perpendicular to a substrate and a plurality of word lines, an individual word line configured to store a lower page and an upper page;
    a memory controller in communication with the MLC 3-D NAND memory array;
    a host interface in communication with the memory controller;
    a unit configured to determine if data to be stored is sufficient to fill a lower page and an upper page of a word line;
    a unit configured to perform full-sequence programming of the lower page and the upper page when the data to be stored is determined to be sufficient to fill the lower page and the upper page of the word line; and
    a unit configured to program the data to be stored at an alternate location other than the word line when the data to be stored is insufficient to fill the lower page and the upper page of the word line.

16. The system of claim 15 wherein the system is in the form of a memory card or an embedded memory system.

17. The system of claim 15 wherein the word line is in a first erase block and the alternate location is in a second erase block.

18. The system of claim 17 wherein the second erase block is a Single Level Cell (SLC) block.

19. The system of claim 15 wherein the multi-level cell (MLC) 3-D NAND memory array is formed by two or more memory dies connected to the memory controller, each memory die including two or more planes.

20. The system of claim 19 further comprising two or more sets of latches, each of the two or more planes connected to a corresponding set of latches, each set of latches configured to hold at least a lower page and an upper page of data together.

* * * * *